(12) United States Patent
Harada et al.

(10) Patent No.: US 6,579,817 B2
(45) Date of Patent: Jun. 17, 2003

(54) DIELECTRIC CERAMIC COMPOSITION AND METHOD FOR PRODUCING THE SAME, AND DEVICE FOR COMMUNICATION APPARATUS USING THE SAME

(75) Inventors: Kenji Harada, Osaka (JP); Hiroshi Kagata, Osaka (JP); Hidenori Katsumura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 270 days.

(21) Appl. No.: 09/838,963

(22) Filed: Apr. 20, 2001

(65) Prior Publication Data
US 2001/0051584 A1 Dec. 13, 2001

(30) Foreign Application Priority Data

Apr. 26, 2000 (JP) ........................................ 2000-126520
Oct. 24, 2000 (JP) ........................................ 2000-324525

(51) Int. Cl.$^7$ .......................... C03L 14/00; C04B 35/10; B32B 15/04
(52) U.S. Cl. .......................... 501/32; 501/119; 501/152; 264/614; 264/301; 428/433; 428/434
(58) Field of Search .......................... 501/32, 119, 152; 264/614, 301; 428/433, 434

(56) References Cited

U.S. PATENT DOCUMENTS

| | | |
|---|---|---|
| 4,777,092 A | 10/1988 | Kawakami et al. |
| 5,350,639 A | 9/1994 | Inoue et al. |
| 5,518,969 A | 5/1996 | Ragan |
| 6,258,462 B1 | 7/2001 | Kagata et al. |

FOREIGN PATENT DOCUMENTS

| | | |
|---|---|---|
| EP | 0 852 274 | 2/1994 |
| JP | 60-21854 | 2/1985 |
| JP | 62-173797 | 7/1987 |
| JP | 3-170346 | 7/1991 |
| JP | 10-188678 | 7/1998 |
| JP | 934 910 | 8/1999 |
| JP | 11-228216 | 8/1999 |
| WO | 89/01461 | 2/1989 |

OTHER PUBLICATIONS

Database WPI, Section Ch, Week 1999944, Derwent Publications Ltd., Londaon, GB; AN 1999–522497, XP002172302 (Apr. 1999).

*Primary Examiner*—David Brunsman
(74) *Attorney, Agent, or Firm*—Merchant & Gould P.C.

(57) ABSTRACT

A dielectric ceramic composition including at least a first component containing $Al_2O_3$, MgO and $RO_a$ (R is at least one element selected from the group consisting of La, Ce, Pr, Nd, Sm, Eu, Tb and Gd; a is a value stoichiometrically determined in accordance with the valence of R); $SiO_2$ as a second component; and a third component containing a glass composition including two or more components containing at least one selected from the group consisting of $SiO_2$ and $B_2O_3$. A dielectric ceramic composition stably has a high strength in a high frequency band such as microwave, millimeter wave, etc., and has a small dielectric constant, a low loss, and a small temperature constant at capacitance.

19 Claims, 3 Drawing Sheets

DIELECTRIC CERAMIC COMPOSITION AND METHOD FOR PRODUCING THE SAME, AND DEVICE FOR COMMUNICATION APPARATUS USING THE SAME

FIELD OF THE INVENTION

The present invention relates to a dielectric ceramic composition useful for a device used as a resonator, a filter, an antenna, a capacitor, an inductor, a circuit board or the like in a high frequency band such as microwave, millimeter wave, etc. The present invention also relates to a device for a communication apparatus including such a dielectric ceramic composition.

BACKGROUND OF THE INVENTION

Recently, dielectric ceramics have been used widely as filter materials for communication apparatus with the spread of mobile communication. Such dielectric ceramics are required to have a low dielectric loss (tan δ), i.e. a high Q value that is the inverse of the dielectric loss, a small absolute value of the temperature coefficient at capacitance (TCC), and a high transverse strength.

It is predicted that the frequency of communication systems will become higher and the shorter wavelength of the radio wave will be used. Therefore, when machining accuracy and conductor loss are taken into account, dielectrics having a low dielectric constant increasingly will be demanded. As an example of a conventional dielectric ceramic composition having a low dielectric constant, a dielectric ceramic composition in which glass is added to $AL_2O_3$ is proposed in, for example, JP 62 (1988)-173797A. As another example of a conventional dielectric ceramic composition having a low dielectric constant, a dielectric ceramic composition in which glass is added to $AL_2O_3$ is proposed in, for example, JP 11 (1999)-228216A.

However, the dielectric ceramic composition in which glass is added to $Al_2O_3$ has a low dielectric constant of 10 or less, but has a large TCC of about 100 ppm/° C. Under such circumstances, a dielectric ceramic composition having a dielectric constant that is at the same level or less than that of this type of dielectric ceramic composition and the TCC being close to zero has been demanded. The present inventors previously proposed a dielectric ceramic composition having a low dielectric constant, a low loss, and a small absolute value of the temperature coefficient at resonance frequency (TCF) in JP11 (1999)-228216A. However, dielectric ceramic compositions having a lower dielectric constant, a higher Q value that is the inverse of the dielectric loss (tan δ), and a smaller absolute value of the temperature coefficient at capacitance (TCC) have been demanded.

SUMMARY OF THE INVENTION

It is therefore an object of the present invention to provide a dielectric ceramic composition capable of being fired at a low temperature and stably having high strength and yet having a lower dielectric constant, a higher Q value that is the inverse of the dielectric loss (tan δ), and a smaller absolute value of the temperature coefficient at capacitance (TCC) as compared with the conventional dielectric ceramic composition, and to provide a device for a communication apparatus using this dielectric ceramic composition suitably in a high frequency band such as microwave, millimeter wave, etc.

In order to achieve the above-mentioned object, the dielectric ceramic composition of the present invention includes at least a first component containing $Al_2O_3$, MgO and $RO_a$ (R is at least one element selected from the group consisting of La, Ce, Pr, Nd, Sm, Eu, Tb and Gd; a is a value stoichiometrically determined in accordance with the valence of R); $SiO_2$ as a second component; and a third component containing a glass composition including two or more components containing at least one selected from the group consisting of $SiO_2$ and $B_2O_3$.

Next, a method for producing a dielectric ceramic composition of the present invention includes melting by preliminarily heating a third component including two or more components containing at least one selected from $SiO_2$ and $B_2O_3$ and then quenching to form a glass composition; pelletizing and mixing a predetermined amount of a first component including $Al_2O_3$, MgO and $RO_a$ (R is at least one element selected from the group consisting of La, Ce, Pr, Nd, Sm, Eu, Tb and Gd, a is a value stoichiometrically determined in accordance with the valence of R), a second component including $SiO_2$; and the third component; granulating the mixture and then molding the granulated product; preheat treating the molded product and then principally firing the product.

Next, a device for a communication apparatus of the present invention uses a dielectric ceramic composition including at least a first component containing $Al_2O_3$, MgO and $RO_a$ (R is at least one element selected from the group consisting of La, Ce, Pr, Nd, Sm, Eu, Tb and Gd; a is a value stoichiometrically determined in accordance with the valence of R); a second component, $SiO_2$; and a third component containing a glass composition including two or more components containing at least one selected from the group consisting of $SiO_2$ and $B_2O_3$.

DETAILED DESCRIPTION OF THE INVENTION

The present invention provides a dielectric ceramic composition including a first component containing $Al_2O_3$, MgO and $RO_a$; $SiO_2$ as a second component; and a third component containing a glass composition including two or more components containing at least one selected from the group consisting of $SiO_2$ and $B_2O_3$. Herein, R is at least one element selected from the group consisting of La, Ce, Pr, Nd, Sm, Eu, Tb and Gd; a is a value stoichiometrically determined in accordance with the valence of R. In general, a is expressed by n/2 when the valence of R is n. For example, when the valence of R is 3, n is 3/2; and when the valence of R is 4, n is 2.

With such a dielectric ceramic composition, it is possible to produce various kinds of devices having a low dielectric constant, small loss and a small absolute value of the temperature coefficient at capacitance (TCC). It is preferable that the dielectric ceramic composition includes the component expressed by the above-mentioned composition formula as a main component.

More specifically, it is preferable that the first component is expressed by a composition formula: $xAlO_{3/2}$—$yMgO$—$zRO_a$, where $x \geq 55$, $y \geq 0.5$, $z \geq 0.5$, and $x+y+z=100$.

Furthermore, it is preferable that the second component is contained in an amount of 40 weight % or less.

Furthermore, it is preferable that the third component is contained in an amount of 90 weight % or less. It is preferable that the third component includes at least one oxide selected from $Al_2O_3$, $ZrO_2$, $TiO_2$, BaO, SrO, CaO, MgO, $La_2O_3$, PbO, ZnO, $Li_2O$, $Na_2O$ and $K_2O$. Furthermore, the above-mentioned dielectric ceramic composition includes a crystal phase including the first component, another crystal phase including the second component in which the X-ray diffraction of powder at a spacing ranging from 0.33 to 0.34 nm is the greatest, and a glass phase including the third component.

Furthermore, it is preferable in the dielectric ceramic composition that the particle size of MgO in the first component is in the range from 1 $\mu$m to 10 $\mu$m.

Furthermore, it is preferable in the dielectric ceramic composition that the first component further contains glass composition containing at least one selected from $SiO_2$ and $B_2O_3$ in an amount of 10 weight % or less.

Next, it is preferable that the temperature for the principal firing is 800° C. or more and 1100° C. or less.

Furthermore, it is preferable that MgO in the first component is preliminarily fired at 1100° C. or more.

Furthermore, it is preferable that the temperature of preliminarily heating and melting of the third component is 800° C. or more and 1700° C. or less.

Furthermore, it is preferable that the molding is press molding.

Furthermore, it is preferable that the temperature of preheat treatment of the dielectric ceramic composition is 350° C. or more and 800° C. or less.

Next, it is preferable that the device for communication apparatus of the present invention includes a laminate formed by laminating a dielectric layer made of a dielectric ceramic composition and a conductive layer including at least one metal selected from Ag, Au, Cu, and Pt. An example of the device for a communication apparatus of the present invention includes a dielectric filter, a dielectric resonator, a dielectric antenna, a capacitor, an inductor, a circuit board or the like.

Figure 1:
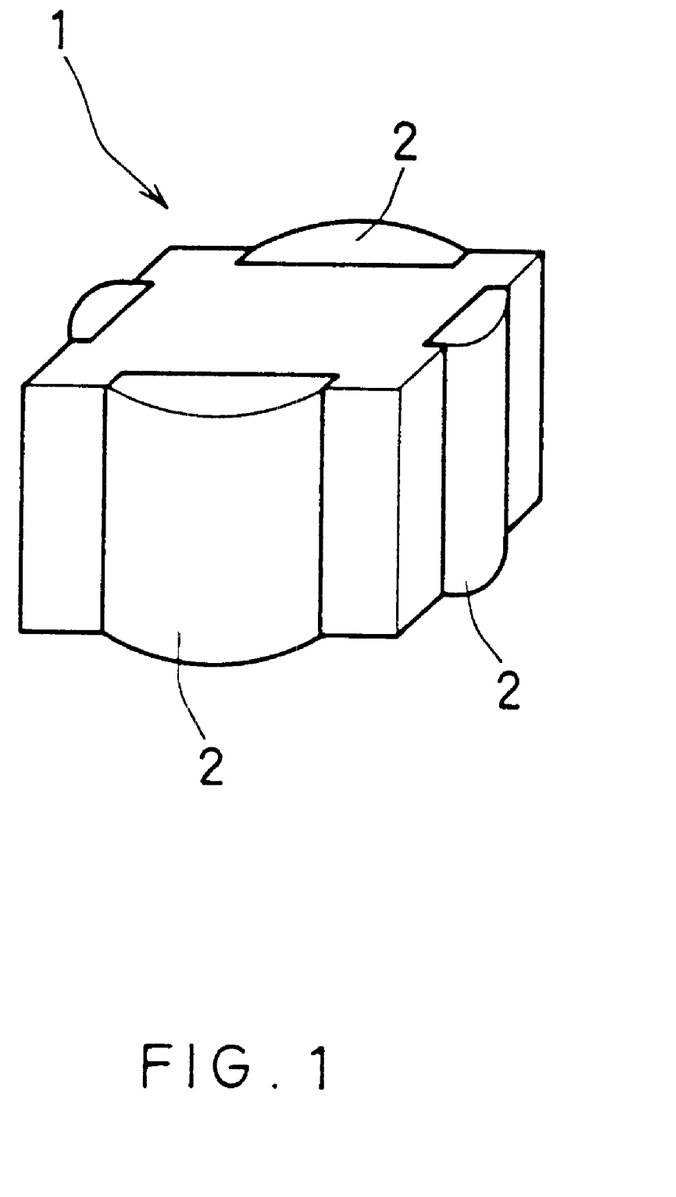
FIG. 1 is a perspective view showing a laminate bandpass filter according to one embodiment of the present invention.
Figure 2:
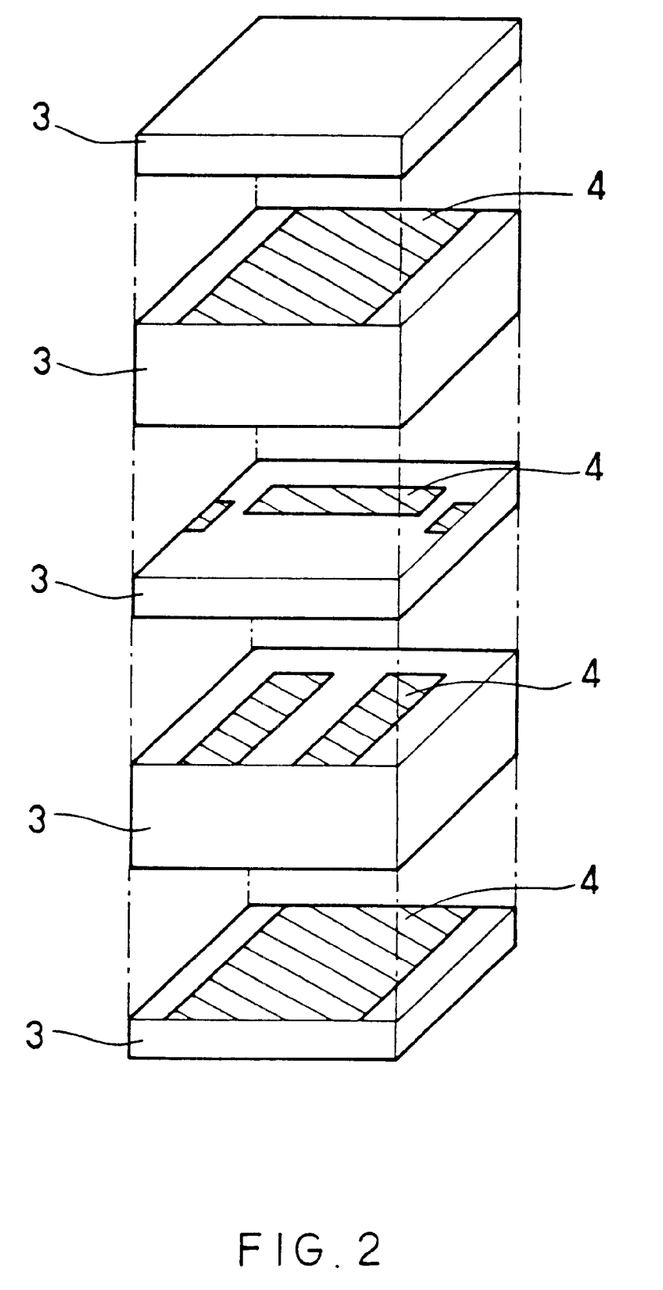
FIG. 2 is a view showing an internal structure of a laminate bandpass filter according to one embodiment of the present invention.

As an example of the device for a communication apparatus of the present invention, a laminate bandpass filter will be explained with reference to drawings. As shown in FIG. 1, the outside of the bandpass filter 1 is provided with a plurality of terminal electrodes 2. FIG. 2 shows an internal structure of a laminate bandpass filter 1 in which a dielectric layer 3 made of the dielectric ceramic composition of the present invention and a conductive layer (an internal electrode 4) containing a metal as a main component are laminated. This laminate bandpass filter is advantageous for miniaturization of apparatus. For example, it is suitable for portable phones. In addition, the dielectric ceramic composition of the present invention is excellent in a temperature property. It also is expected to be applied to a high damping device in a narrow band.

Hereinafter, examples of methods for obtaining a molded body including the dielectric ceramic composition of the present invention will be described.

As starting materials for producing the dielectric ceramic composition of the present invention, oxide, carbonate, nitrate and organometallic salt or the like of each constituent element are used. The purity of 99% or more is preferred, although it is not particularly limited thereto. These materials are weighed so that the amounts thereof are in the above-mentioned composition ranges and mixed. The mixing is carried out in a ball mill, a medium stirring mill, a mortar or the like. Any of wet mixing and dry mixing may be employed. In the case of the wet mixing, water, alcohol, ether or the like can be used as the solvent. If necessary, the dried mixture is thermally treated in a melting pot. The melting pot made of mullite, alumina, platinum or the like is preferred. The temperature for the thermal treatment is preferably in the range from 800 to 1700° C.

In order to obtain a glass phase, the molten material is quenched. The quenching can be carried out by, for example, a method of dripping materials melted by heating into water, a method of dripping the materials onto a metal plate, or the like. The obtained thermally treated materials are ground by the same method as the above-mentioned mixing. In grinding, if necessary, drying may also be carried out. Thus, the dielectric crystalline powder and glass powder is obtained. If necessary, the dielectric crystalline powder and glass powder are mixed and dried by the same method as the above-mentioned mixing.

Next, the obtained powders are granulated. Examples of methods for granulating powders includes: a method of adding a binder, kneading and granulating by sieving through a mesh screen; a method using a commercially available granulating machine by a spray-dry, etc. As the binder, polyvinyl alcohol binder, wax binder, acrylic binder or the like can be used. Furthermore, the additive amount of the binder is preferably in the range from 1 to 25 weight % with respect to the powder. Furthermore, the hole diameter of the mesh is preferably in the range from 100 $\mu$m to 1000 $\mu$m.

Then, the granulated powders are press-molded. As the method for press-molding, uniaxial press molding with a mold, isostatic molding or the like are preferred. The molding pressure is preferably in the range from 100 to 2000 kg/cm². The obtained molded body is thermally treated in an oxidizing atmosphere, for example, in the air at 350 to 800° C. to remove the binder components, followed by further firing at 800 to 1100° C. The firing atmosphere is not particularly limited, and thus may be a neutral atmosphere or an oxidizing atmosphere.

The above-described method can provide a dielectric ceramic composition in the form of a sintered body. The dielectric ceramic compositions are formed into various kinds of devices for a communication apparatus by appropriate combination with metallic conductors by conventional methods.

As mentioned above, according to the present invention, a dielectric ceramic composition includes at least a first component containing $Al_2O_3$, MgO and $RO_a$ wherein R is at least one element selected from the group consisting of La, Ce, Pr, Nd, Sm, Eu, Tb and Gd; a is a value stoichiometrically determined in accordance with the valence of R; $SiO_2$ as a second component; and a third component containing a glass composition including two or more components containing at least one selected from the group consisting of $SiO_2$ and $B_2O_3$, whereby the dielectric ceramic composition can have a low dielectric constant and practical level of dielectric loss and small absolute value of temperature constant at capacitance (TCC). Furthermore, by setting the firing temperature of MgO in the first component to be 1100° C. or more, it is possible to provide a stable dielectric ceramic composition. Furthermore, by setting a particle size of the material of MgO in the first component to be 1 μm to 10 μm, it is possible to provide a stable dielectric ceramic composition. Furthermore, by allowing the first component to include a glass composition including at least one selected from $SiO_2$ and $B_2O_3$, it is possible to provide a stable dielectric ceramic composition. With such a dielectric ceramic composition, a device for a communication apparatus suitably used in a high frequency band such as microwave, millimeter wave, etc. can be produced. Such a device for communication apparatus also can be used as, for example, a laminate device including a conductive layer.

Embodiment

Figure 3:
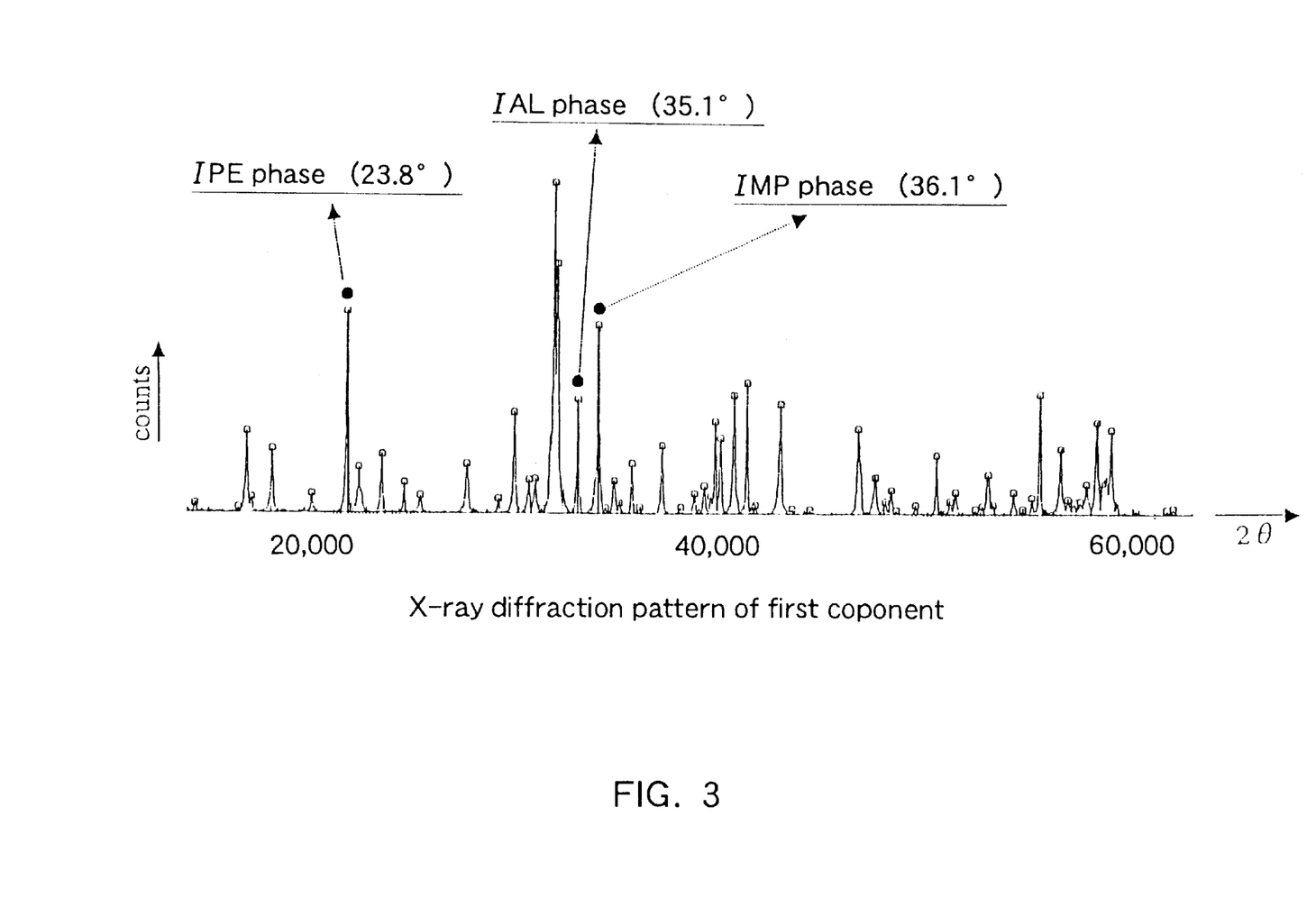
FIG. 3 is a graph showing an X-ray diffraction pattern of a first component of one embodiment of the present invention.

Hereinafter, the present invention will be explained in detail by way of Examples Moreover, in the following Examples, properties of the first component were evaluated by examining the generated phase of the synthesized first component by means of the X-ray diffraction analysis (radiation source: CuK α). The principal generated phase includes a magneto-plumbite phase (MP), a perovskite phase (PE), and an unreacted alumina phase (Al). FIG. 3 is a graph showing the peak of the X-ray diffraction pattern of the first component. The generation rate of the MP phase was calculated easily by the ratio of the peak strength (I) of each generated phase (MP phase, PE phase, and Al phase) by the following formula (Formula 1) and evaluated.

MP phase generation rate={IMP phase(36.1°)}/{IMP phase(36.1°)+IAL phase (35.1°)+IPE phase(23.8°)}  (Formula 1)

Moreover, properties of the dielectric ceramic composition were evaluated in terms of the dielectric constant, the dielectric loss (Q value), the temperature coefficient at capacitance (TCC) and the transverse strength. The dielectric constant and the dielectric loss (Q value) were determined by the dielectric resonator method by using a network analyzer. The resonance frequency at this time was set to be 3 GHz to 10 GHz. Moreover, the TCC was calculated by the least square method by measuring the capacitance of the sintered body from 85° C. to 20° C. Furthermore, the transverse strength was measured by a four-point bending method.

EXAMPLE 1

$Al_2O_3$, MgO, $La_2O_3$, $CeO_2$, $Pr_6O_{11}$, $Nd_2O_3$, $Sm_2O_3$ and $Gd_2O_3$ were used as the starting materials. These starting materials were blended so that the composition formula: $xAlO_{3/2}$—yMgO—$zRO_a$(R: La, Ce, Pr, Nd, Sm, and Gd) was satisfied wherein x, y and z were in the values given in Table 1.

Then, glass powder was prepared by the following method. $SiO_2$, $B_2O_3$, $Al_2O_3$, $CaCO_3$, $SrCO_3$, $BaCO_3$, $La_2O_3$, $ZrO_2$, $TiO_2$, MgO, PbO, ZnO, $Li_2CO_3$, $Na_2CO_3$ and $K_2CO_3$ were used as the starting materials. These starting materials were appropriately selected and blended so that the total amount became 60 g. These materials were placed in a 600 cc polyethylene pot with 130 cc of ethanol and 600 g of zirconia balls of 10 mm in diameter, mixed by rotating thereof for 18 hours and ground. The slurry mixture was placed in a metallic vat and dried at 150° C. The dried mixture was placed in a platinum melting pot, covered, and melted at 1300° C. Thereafter, the molten body was quenched by placing it in water. The obtained glass was ground by the same method as mixing, and dried. Thus, glass powder was obtained.

The dielectric powder (the first component), $SiO_2$ (the second component) and the glass powder (the third component) were blended in a total amount of 60 g at the ratio of 20 g, 10 g, and 30 g. This blended body was placed in a 600 cc polyethylene pot and rotated for 20 hours so as to mix and grind. The slurry mixture was put into a metal pallet and dried at 150° C. 25 weight % of polyvinyl alcohol binder was added to the obtained dielectric material powder, kneaded, and granulated by sieving through a mesh having a hole diameter of 30 μm. The granulated powders were filled in a mold and molded by the uniaxis press-molding method at a pressure of 500 kg/cm². This press-molded body was held in the air at 600° C. for 2 hours to remove the binder components, and then fired at a temperature in the range from 850 to 1050° C. The size of the sintered body was about 11 mm in diameter and about 7 mm in height. The sintered bodies obtained by firing at various temperatures within the above-mentioned range and having the maximum density were evaluated in terms of the dielectric property by the above-described method. Compositions of the formed glass are shown in Table 2 and compositions and properties of the obtained sintered bodies were shown in Table 1.

TABLE 1

| No. | x | y | z | ft *1 [° C.] | $\epsilon_r$ | Qf [GHz] | TCF [ppm/° C.] |
|---|---|---|---|---|---|---|---|
| 1# | 25 | 37.5 | 37.5 | Not sintered | | | |
| 2 | 83.1 | 7.7 | 9.2 | 950 | 6 | 7000 | 29 |
| 3 | 84.6 | 7.7 | 7.7 | 900 | 6 | 7000 | 48 |
| 4 | 84.7 | 5.9 | 9.4 | 900 | 7 | 7000 | 44 |
| 5 | 86.3 | 5.9 | 7.8 | 900 | 6 | 7000 | 27 |
| 6 | 86.4 | 4 | 9.6 | 950 | 5 | 6000 | 26 |
| 7 | 88 | 4 | 8 | 900 | 6 | 7000 | 28 |
| 8 | 91 | 0.7 | 8.3 | 900 | 4 | 5000 | 50 |
| 9# | 91.7 | 0 | 8.3 | 900 | 4 | 5000 | 110 |
| 10 | 87.8 | 5.9 | 6.3 | 1000 | 7 | 8000 | 38 |
| 11 | 91.4 | 4 | 4.6 | 950 | 5 | 7000 | 49 |
| 12 | 89.6 | 5.9 | 4.5 | 950 | 5 | 8000 | 25 |
| 13 | 91.2 | 8 | 0.8 | 950 | 4 | 9000 | 21 |
| 14# | 92 | 8 | 0 | 950 | 3 | 10000 | 115 | ft *1 = firing temperature

TABLE 2

| | $SiO_2$ | $B_2O_3$ | $Al_2O_3$ | CaO | BaO | $ZrO_2$ | Other materials |
|---|---|---|---|---|---|---|---|
| I | 50 | 20 | 10 | 10 | 10 | | |
| II | 47 | 20 | 15 | 10 | | 8 | |
| III | 45 | 25 | | 10 | | | MgO 5 $Na_2O$ 5 (weight %) |

In the samples Nos. 1–14 shown in Table 1, the sample No. 1 in which less than 50 weight % of $AlO_{3/2}$ was added was not sintered. Furthermore, in sample No. 9 in which less than 0.5 weight % of MgO was added, and the sample No. 14 in which less than 0.5 weight % of $RO_a$ was added had the temperature coefficient at capacitance (TCC) of 100 ppm/° C. or more. However, in the samples other than the samples marked with # (i.e. Nos. 1, 9 and 4), the dielectric constant was as small as 10 or less, and the temperature coefficient at capacitance (TCC) was 100 ppm/° C. or less, exhibiting excellent properties.

In this way, according to the dielectric ceramic compositions in which $SiO_2$ and glass composition were added to the oxide expressed by the above-mentioned composition formula, the low dielectric constant and the practical level of Qf product and the TCC could be achieved.

EXAMPLE 2

A dielectric powder was obtained by the same method as in Example 1. The composition of the dielectric powder was expressed by the composition formula: $44AlO_{3/2}$—$3MgO$—$4RO_a$ (R: La, Nd, Sm, and Gd; and a is a value stoichiometrically determined in accordance with the valence of R). Furthermore, also glass powder was prepared by the same method as in Example 1.

The dielectric powder (the first component), $SiO_2$ (the second component) and the glass powder (the third component) were appropriately selected and blended so that a total amount became 60 g, and thus a sintered body was obtained by the same method as in Example 1. The size of the sintered body was about 11 mm in diameter and about 7 mm in height. The dielectric properties of the sintered bodies obtained by firing at various temperatures within the above-mentioned range were evaluated by the above-mentioned method. Compositions of the formed glass are shown in Table 2, and compositions and properties of the obtained sintered bodies are shown in Table 3, respectively.

diffraction analysis, a phase that seems to include $SiO_2$ as a main component in which the X-ray diffraction of powder at a spacing ranging from 0.33 to 0.34 nm is the greatest was detected.

In Table 3, the sample No. 36 is an example of the invention disclosed in JP11 (1999)-228216A and given as a comparative example wherein the second component was not added. When the samples Nos. 30–31 ranging in the present invention are compared with the sample No. 36, the samples Nos. 30–31 are shown to have a lower dielectric constant ($\in r$), a higher Qf value that is the inverse of the dielectric loss (tan δ), and a small absolute value of the temperature coefficient at capacitance (TCC).

EXAMPLE 3

$Al_2O_3$, MgO, and $Gd_2O_3$ were used as the starting materials. These starting materials were blended so that the

TABLE 3

| No. | R*1 | Amount *2 [wt. %] | Kind *3 | Amount *4 [wt. %] | ft *5 [° C.] | $\epsilon_r$ | Qf [GHz] | TCC [ppm/° C.] |
|---|---|---|---|---|---|---|---|---|
| 21 | La | 25 | I | 50 | 950 | 5 | 8000 | −19 |
| 22 | La | 25 | II | 50 | 900 | 5 | 7000 | −21 |
| 23 | Nd | 25 | II | 50 | 950 | 5 | 8000 | −13 |
| 24 | Nd | 25 | III | 50 | 1050 | 5 | 9000 | −11 |
| 25 | Sm | 25 | I | 50 | 950 | 6 | 9000 | 3 |
| 26 | Sm | 3 | I | 87 | 900 | 8 | 12000 | 29 |
| 27# | Sm | 3 | I | 92 | 900 | | Not measurable | |
| 28# | La | 3 | II | 92 | 900 | | Not measurable | |
| 29 | La | 10 | II | 85 | 850 | 7 | 9000 | 7 |
| 30 | Gd | 25 | I | 50 | 950 | 6 | 7000 | 24 |
| 31 | Gd | 33 | I | 50 | 950 | 5 | 7000 | 23 |
| 32# | Gd | 42 | I | 50 | | | Not sintered | |
| 33# | Nd | 45 | III | 50 | | | Not sintered | |
| 34 | Nd | 10 | III | 60 | 900 | 8 | 9000 | −27 |
| 35 | Nd | 25 | II | 25 | 850 | 3 | 6000 | −52 |
| 36# | Gd | 0 | I | 50 | 850 | 9 | 4000 | −40 |

R*1 = R in the first component
Amount *2 = amount of the second component
Kind *3 = kind of the third component
Amount *4 = amount of the third component
ft *5 = firing temperature In the samples shown in Table 3, in the samples Nos. 27 and 28 in which more than 90 weight % or more of glass composition was added, the Qf product was lowered and the dielectric properties were not measurable. Moreover, the samples Nos. 32 and 33 in which more than 40 weight % of $SiO_2$ (the second component) was added were not sintered. On the other hand, the other dielectric ceramic compositions were sintered at a low temperature of 1050° C. or less, exhibiting excellent properties, i.e., the dielectric constant of 8 or less, the Qf product of 6000 GHz or more, and the TCC value of less than 100 ppm/° C. (i.e. an absolute value of 100 ppm/° C. or less). Thus, in the dielectric ceramic compositions, $SiO_2$ was added to the oxide expressed by the above-mentioned composition formula in an amount of 40 weight % or less, and further glass composition was added in an amount of 90 weight % or less, the low dielectric constant and the practical level of Qf value and TCC could be achieved.

Furthermore, in the dielectric ceramic composition exhibiting such excellent properties, in particular, the samples Nos. 25 and 29 had the TCC of 10 ppm/° C. or less. Furthermore, the samples other than the sample No. 24 could be fired at low temperatures of 950° C. or less.

Furthermore, when the generated phase of the sintered body produced in this example was analyzed by the X-ray composition formula: $44AlO_{3/2}$— $3MgO$—$4GdO_{3/2}$ was satisfied. The firing temperature and particle size of MgO at this time were set to be the values shown in Tables 4 and 5. Furthermore, the glass powder was obtained by the same method as in Example 1.

The dielectric powder (the first component), $SiO_2$ (the second component) and the glass powder (the third component) were blended so that a total amount became 60 g in the ratio of 20 g, 10 g, and 30 g, and thus a sintered body was obtained by the same method as in Example 1. The size of the sintered body was about 11 mm in diameter and about 7 mm in height. The dielectric properties of the sintered bodies obtained by firing at various temperatures within the above-mentioned range, and having the maximum density were evaluated by the above-mentioned method. Tables 4 and 5 show the properties of the obtained sintered bodies.

TABLE 4

| | ft *1 [° C.] | gr *2 [%] | ft *3 [° C.] | $\epsilon r$ | QF [GHz] | TCC [ppm/° C.] | ts*4 [MPa] |
|---|---|---|---|---|---|---|---|
| 41# | 900 | 66 | 1050 | 7.52 | 15000 | 30 | 173 |
| 42# | 1000 | 72 | 1000 | 7.48 | 17000 | 27 | 184 |

TABLE 4-continued

|  | ft *1 [° C.] | gr *2 [%] | ft *3 [° C.] | ϵr | QF [GHz] | TCC [ppm/° C.] | ts*4 [MPa] |
|---|---|---|---|---|---|---|---|
| 43 | 1100 | 85 | 950 | 7.63 | 15000 | 25 | 207 |
| 44 | 1200 | 88 | 925 | 7.78 | 14000 | 14 | 224 |
| 45 | 1300 | 92 | 925 | 7.79 | 12000 | 3 | 228 |
| 46 | 1400 | 98 | 900 | 7.77 | 11000 | 22 | 231 | ft *1 = firing temperature of MgO
gr *2 = generation rate of MP phase
ft *3 = firing temperature
ts*4 = transverse strength [MPa]

TABLE 5

|  | ps *1 [μm] | gr*2 [%] | ft *3 [° C.] | ϵr | QF [GHz] | TCC [ppm/° C.] | ts*4 [MPa] |
|---|---|---|---|---|---|---|---|
| 51# | 0.1 | 64 | 1050 | 7.50 | 15000 | 33 | 169 |
| 52# | 0.6 | 72 | 1000 | 7.48 | 17000 | 27 | 184 |
| 53 | 1.0 | 80 | 950 | 7.65 | 15000 | 24 | 203 |
| 54 | 3.0 | 88 | 925 | 7.78 | 14000 | 14 | 217 |
| 55 | 5.0 | 92 | 925 | 7.79 | 12000 | 3 | 228 |
| 56 | 10.0 | 85 | 950 | 7.71 | 15000 | 20 | 201 |
| 57# | 11.0 | 83 | 950 | 7.63 | 17000 | 26 | 198 | ps *1 = particle size of MgO
gr*2 = generation rate of MP phase
ft *3 = firing temperature
ts*4 = transverse strength [MPa]

In the samples shown in Table 4, the sample Nos. 41 and 42 in which the firing temperature of MgO was 1000° C. or less, the generation rate of the MP phase was as low as 75% or less and the firing temperature of the dielectric composition was as high as 1000° C. or more. On the other hand, the samples Nos. 43–46 in which the firing temperature of MgO was 1100° C. or more, the generation rate of MP phase was as high as 85% or more. Furthermore, the dielectric ceramic composition was fired at a low temperature of 950° C. or less, exhibiting excellent properties, i.e., the dielectric constant of 8 or less, the Qf product of 11000 GHz or more, the TCC value of less than 25 ppm/° C., and the transverse strength of more than 200 MPa. Thus, in the dielectric ceramic compositions in which MgO was fired at 1100° C. or more, high generation rate of the MP phase, a low dielectric constant, and the practical level of Qf product, TCC and transverse strength could be achieved.

Furthermore, in the dielectric ceramic compositions having excellent properties, in particular, the sample No. 45 had TCC of 10 ppm/° C. or less.

In the samples shown in Table 5, the samples Nos. 51 and 52, the particle size of MgO is smaller than 1 μm, the generation rate of the MP phase was so small as 75% or less, and the firing temperature was so high as 1000° C. or more. Furthermore, in the sample No. 57 in which a particle size of MgO was more than 11 μm had the generation rate of the MP phase was less than 85%, and the transverse strength was less than 200 MPa. On the other hand, in the samples Nos. 53–56 having a particle size of MgO of 1 μm to 10 μm, the generation rate of the MP phase was so high as 80% or more. Furthermore, the dielectric ceramic composition was fired at a low temperature of 950° C. or less, exhibiting excellent properties, i.e., the dielectric constant of 8 or less, the Qf product of 12000 GHz or more, the TCC value of less than 25 ppm/° C. and the transverse strength of more than 200 MPa. Thus, in the dielectric ceramic compositions using MgO of the particle size of 1 μm to 10 μm, a high generation rate of the MP phase, a low dielectric constant, and the practical level of Qf product, TCC and transverse strength could be achieved.

Furthermore, the dielectric ceramic composition had excellent properties, in particular, the sample No. 55 had the TCC of 10 ppm/° C. or less.

EXAMPLE 4

$Al_2O_3$, MgO, and $Gd_2O_3$ were used as the starting materials. The glass powder prepared by the same method as in Example 1 was added to these starting materials to blend a dielectric powder. $SiO_2$, $B_2O_3$, $Al_2O_3$, $CaCO_3$, $BaCO_3$, $La_2O_3$ and ZnO were used as the starting materials for glass powder. Furthermore, the composition of the dielectric powder was expressed by a composition formula: $44AlO_{3/2}$—$3MgO$—$4GdO_{3/2}$.

The dielectric powder (the first component), $SiO_2$ (the second component) and the glass powder (the third component) were appropriately selected and blended so that a total amount became 60 g, and thus the sintered body was obtained by the same method as in Example 1. The size of the sintered body was about 11 mm in diameter and about 7 mm in height. The dielectric properties of the sintered bodies obtained by firing at various temperatures within the above-mentioned range were evaluated by the above-mentioned method. Compositions of the formed glass are shown in Table 6, and compositions and properties of the resultant sintered body are shown in Table 7.

TABLE 6

|  | $SiO_2$ | $B_2O_3$ | $Al_2O_3$ | CaO | BaO | ZnO | $La_2O_3$ |
|---|---|---|---|---|---|---|---|
| IV | 60 | 40 |  |  |  |  |  |
| V |  | 60 | 5 | 10 | 25 |  |  |
| VI | 50 | 5 | 5 | 12 | 25 | 3 |  |
| VII | 44 | 5 | 6 |  | 35 |  | 10 |

(weight %)

TABLE 7

|  | glass | *1 [wt. %] | *2 [%] | *3 [° C.] | ϵr | Qf [GHz] | TCC [ppm/° C.] | *4 [MPa] |
|---|---|---|---|---|---|---|---|---|
| 61# | none | 0 | 72 | 1000 | 7.5 | 17000 | 27 | 184 |
| 62 | IV | 1 | 97 | 950 | 7.7 | 18000 | 25 | 237 |
| 63 | V | 1 | 99 | 950 | 7.6 | 16000 | 23 | 252 |
| 64 | VI | 1 | 100 | 950 | 7.8 | 12000 | 19 | 260 |
| 65 | VII | 1 | 100 | 950 | 7.7 | 12000 | 23 | 238 |
| 66 | IV | 5 | 100 | 1000 | 6.9 | 11000 | 34 | 220 |
| 67 | VI | 5 | 100 | 1000 | 7.1 | 12000 | 28 | 212 |
| 68 | V | 10 | 100 | 1100 | 7.0 | 9000 | 46 | 205 |
| 69 | VI | 10 | 100 | 1100 | 7.0 | 7000 | 48 | 201 |

TABLE 7-continued

| glass | *1 [wt. %] | *2 [%] | *3 [° C.] | ∈r | Qf [GHz] | TCC [ppm/° C.] | *4 [MPa] |
|---|---|---|---|---|---|---|---|
| 70# | VI | 11 | 100 | 1100 | 6.9 | 6000 | 53 | 193 |
| 71# | VII | 11 | 100 | 1100 | 6.8 | 6000 | 57 | 195 |

*1 = additive amount
*2 = generation rate of MP phase
*3 = firing temperature
*4 = transverse strength In the samples shown in Table 7, the sample No. 61 in which glass was not added had a small generation rate of the MP phase of 75% or less and a transverse strength of the dielectric ceramic composition was less than 200 MPa. Furthermore, the samples Nos. 70 and 71 in which 11 weight % of glass was added had a generation rate of MP phase reaching 100%, however, the TCC of the dielectric ceramic composition was more than 50 ppm/° C. and a transverse strength was less than 200 MPa. On the other hand, the samples Nos. 62–69 in which glass was added in an amount of 1–10 weight %, the generation rate of MP phase was as high as 95% or more. Furthermore, the dielectric ceramic composition had excellent properties, i.e., the dielectric constant of 8 or less, QF product of 7000 GHz or more, TCC value of 50 ppm/° C. or less, and a transverse strength of 200 MPa or more. Thus, according to the dielectric ceramic composition using the first component in which glass powder was added to $Al_2O_3$, MgO, and $Gd_2O_3$, a high generation rate of a MP phase, a low dielectric rate and the practical level of Qf product, TCC and transverse strength could be achieved.

Furthermore, in the dielectric ceramic compositions exhibiting excellent properties, in particular, the samples Nos. 62–65 could be fired at a temperature of 950° C. or less. In addition, in the sample No. 64, it was possible to achieve the TCC of 20 ppm/° C. or less, and the transverse strength of 250 MPa or more.

The dielectric powders produced in the above-mentioned Examples were formed into a green sheet, printed with an Ag paste, compressed with pressure applied, cut into individual pieces and fired. As a result, a laminate having an excellent property was obtained. Thus, the dielectric ceramic composition of the present invention can be used as a device having a laminated structure in which a layer made of metals such as Ag, Au, Cu, Pd, etc., is laminated onto the dielectric ceramic composition. Furthermore, as is apparent from the above-mentioned Examples, each of the dielectric compositions can be used as a high-frequency device that exhibits excellent properties, particularly in a GHz band, that is, a band for evaluating properties, by appropriately combining the metals.

Moreover, according to the above-mentioned methods, elements such as Zr, Ti, Si, Fe, Ca, etc. may be present as contaminants during the production process, or may be contained in the starting materials. However, such impurities are allowed to be present as long as the object of the present invention can be achieved. However, the total concentration of the impurities is preferably 0.2 weight % or less based on the oxide.

The invention may be embodied in other forms without departing from the spirit or essential characteristics thereof The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A dielectric ceramic composition, comprising
a first component containing $Al_2O_3$, MgO and $RO_a$ wherein R is at least one element selected from the group consisting of La, Ce, Pr, Nd, Sm, Eu, Tb and Gd; a is a value stoichiometrically determined in accordance with the valence of R;
$SiO_2$ as a second component; and
a third component containing a glass composition comprising two or more components containing at least one selected from the group consisting of $SiO_2$ and $B_2O_3$.

2. The dielectric ceramic composition according to claim 1, wherein the first component is expressed by a composition formula:

$xAlO_{3/2}$—$yMgO$—$zRO_a$ wherein $x \geq 55$, $y \geq 0.5$, $z \geq 0.5$, and $x+y+z=100$.

3. The dielectric ceramic composition according to claim 1, wherein the first component is present in an amount of 5 weight % or more and 50 weight % or less.

4. The dielectric ceramic composition according to claim 1, wherein the second component is present in an amount of more than 0 weight % and 40 weight % or less.

5. The dielectric ceramic composition according to claim 1, wherein the third component is present in an amount of more than 0 weight % and 90 weight % or less.

6. The dielectric ceramic composition according to claim 1, wherein the third component further comprises at least one oxide selected from the group consisting of $Al_2O_3$, $ZrO_2$, $TiO_2$, BaO, SrO, CaO, MgO, $La_2O_3$, PbO, ZnO, $Li_2O$, $Na_2O$ and $K_2O$.

7. The dielectric ceramic composition according to claim 1, wherein the first component is a crystal phase.

8. The dielectric ceramic composition according to claim 1, wherein the second component is a crystal phase in which the X-ray diffraction of powder at a spacing ranging from 0.33 to 0.34 nm is the greatest.

9. The dielectric ceramic composition according to claim 1, comprising a crystal phase comprising the first component, another crystal phase comprising the second component in which the X-ray diffraction of powder at a spacing ranging from 0.33 to 0.34 nm is the greatest, and glass phase comprising the third component.

10. The dielectric ceramic composition according to claim 1, wherein the particle size of MgO in the first component is in the range from 1 μm to 10 μm.

11. The dielectric ceramic composition according to claim 1, wherein the first component further comprises a glass composition containing at least one selected from the group consisting of $SiO_2$ and $B_2O_3$ in an amount of 10 weight % or less.

12. A method for producing a dielectric ceramic composition comprising:
  melting by preliminarily heating a third component comprising two or more components containing at least one selected from the group consisting of $SiO_2$ and $B_2O_3$ and then quenching to form a glass composition;
  pelletizing and mixing a predetermined amount of a first component comprising $Al_2O_3$, MgO and $RO_a$ wherein R is at least one element selected from the group consisting of La, Ce, Pr, Nd, Sm, Eu, Tb and Gd, a is a value stoichiometrically determined in accordance with the valence of R, a second component comprising $SiO_2$; and the third component;
  granulating the mixture and then molding the granulated product,
  preheat treating the molded product and then principally firing the molded product.

13. The method according to claim 12, wherein the temperature for the principally firing is 800° C. or more and 1100° C. or less.

14. The method according to claim 12, wherein MgO in the first component is preliminarily fired at 1100° C. or more.

15. The method according to claim 12, wherein the temperature for preliminarily heating and melting the third component is 800° C. or more and 1700° C. or less.

16. The method according to claim 12, wherein the molding is press molding.

17. The method according to claim 12, wherein the temperature for the preliminarily heat treatment of the dielectric ceramic composition is 350° C. or more and 800° C. or less.

18. A device for a communication apparatus comprising a dielectric ceramic composition that comprises
  a first component containing $Al_2O_3$, MgO and $RO_a$ wherein R is at least one element selected from the group consisting of La, Ce, Pr, Nd, Sm, Eu, Tb and Gd; a is a value stoichiometrically determined in accordance with the valence of R;
  $SiO_2$ as a second component; and
  a third component containing a glass composition comprising two or more components containing at least one selected from the group consisting of $SiO_2$ and $B_2O_3$.

19. The device for a communication apparatus according to claim 18, comprising a laminate formed by laminating a dielectric layer made of the dielectric ceramic composition and a conductive layer comprising at least one metal selected from the group consisting of Ag, Au, Cu, and Pt.

* * * * *

UNITED STATES PATENT AND TRADEMARK OFFICE
CERTIFICATE OF CORRECTION

PATENT NO. : 6,579,817 B2
DATED : June 17, 2003
INVENTOR(S) : Harada et al.

It is certified that error appears in the above-identified patent and that said Letters Patent is hereby corrected as shown below:

<u>Title page,</u>
Item [56], References Cited, FOREIGN PATENT DOCUMENTS,
"EP 0 852 274 should read -- EP 0 582 274 --

Signed and Sealed this

Ninth Day of March, 2004

JON W. DUDAS
*Acting Director of the United States Patent and Trademark Office*